(12) United States Patent
Cheng et al.

(10) Patent No.: US 6,247,599 B1
(45) Date of Patent: Jun. 19, 2001

(54) ELECTROSTATIC DISCHARGE-FREE CONTAINER EQUIPPED WITH METAL SHIELD

(75) Inventors: Dong-Hsu Cheng; Yung Haw Liaw; Deng-Guey Juang, all of Hsinchu (TW)

(73) Assignee: Taiwan Semiconductor Manufacturing Company, Ltd, HsinChu (TW)

( * ) Notice: Subject to any disclaimer, the term of this patent is extended or adjusted under 35 U.S.C. 154(b) by 0 days.

(21) Appl. No.: 09/483,219

(22) Filed: Jan. 14, 2000

(51) Int. Cl.[7] .................................................. B65D 85/00
(52) U.S. Cl. .......................... 206/723; 206/454; 428/34.4
(58) Field of Search .................................. 206/719, 720, 206/721, 723, 454; 428/34.4, 35.3, 35.5

(56) References Cited

U.S. PATENT DOCUMENTS

| | | | |
|---|---|---|---|
| 4,494,651 | * | 1/1985 | Malcolm ............................... 206/721 |
| 4,722,025 | * | 1/1988 | Robinson ............................... 206/721 |
| 5,218,510 | * | 6/1993 | Bradford ............................... 206/583 |
| 5,613,610 | * | 3/1997 | Bradford ............................... 206/721 |

* cited by examiner

Primary Examiner—Paul T. Sewell
Assistant Examiner—Shian Luong
(74) Attorney, Agent, or Firm—Tung & Associates

(57) ABSTRACT

An electrostatic discharge-free container equipped with a metal shield for holding an insulating article therein is described. In the container, an electrically conductive layer substantially covers a bottom lid made of a non-conductive material so as to sufficiently shield the insulating article from electrostatic discharge damages. The present invention novel ESD-free container may further be provided with a metal knob situated in a top lid of the container, or be provided with a metal enclosure positioned inside the container between the top lid and the insulating article. The metal layer that substantially overlaps the bottom lid may be injection molded as an insert in the bottom lid, or may be coated or plated on the bottom lid. The present invention novel ESD-free container eliminates any electrostatic discharge from occurring on a reticle plate and thus avoiding any potential damages. The present invention ESD-free reticle pod may be easily modified from existing reticle pod and therefore provides a low cost retrofit method for providing ESD-free containers.

7 Claims, 2 Drawing Sheets

$d_1 = 1cm$
$D = 5cm$
$X = 0.2286$ cm for 5 inch reticle
$X = 0.6350$ cm for 6 inch reticle

ELECTROSTATIC DISCHARGE-FREE CONTAINER EQUIPPED WITH METAL SHIELD

FIELD OF THE INVENTION

The present invention generally relates to a container for holding articles made of an electrically insulating material and more particularly, relates to a container that is electrostatic discharge-free (ESD-free) for storing articles made of an electrically insulating material for preventing ESD damages by using a metal shield inside the container.

BACKGROUND OF THE INVENTION

In the semiconductor fabrication process, a square cross-sectional or rectangular cross-sectional container made of a plastic material is frequently used to transport articles. These articles may include silicon wafers, reticles or other substrates used for building IC devices. A reticle is a transparent ceramic substrate that is coated with a metallic layer forming a pattern for an electronic circuit. It is generally used in an imaging step during a photolithographic process wherein a pattern of a circuit is reproduced on the surface of an electronic substrate, i.e., on a wafer surface.

A reticle can be constructed of any suitable transparent ceramic materials. One of the most commonly used material is quartz or silicon dioxide. A quartz reticle can be readily coated with a chrome layer at selective areas to reproduce an electrical circuit. The chrome metal layer may be formed by either a pure chromium or a chromium alloy. During a photolithographic imaging process, a light source is projected from one side of the reticle that is coated with the pattern such that the pattern can be reproduced on the surface of a wafer which is positioned on the opposite side of the reticle. The pattern for the electronic circuit coated on the reticle is frequently laid out in a 5× magnification. The true dimensions of the electronic circuit reproduced on the wafer surface can be obtained by suitably adjusting the optical lenses situated between the reticle and the wafer. Metallic coatings other than chrome may also be coated on the surface of the reticle for the circuit lay-out. However, chrome has been found to be an ideal material for its appearance of a brownish tone and its ease of identification by human eyes.

In a semiconductor fabrication facility, static electricity or electrostatic discharge frequently develops on surfaces of articles made of insulating materials when they are touched or rubbed by other insulating materials such as insulating gloves. The electricity is produced based on a triboelectricity theory. The discharge of the static electricity to machines and to human operators can cause damages to semiconductor wafers and process tools. Sometimes, it may even cause injury to a machine operator. In a semiconductor fabrication facility, it is therefore necessary to control ESD by grounding the machines, by controlling the relative humidity, or by building walls and floor coverings with slightly conductive materials such that electrical charges can be routed to ground. When the triboelectricity is suitably controlled, the control of dust and particulate contamination is also enhanced. For instance, the metal racks, pipe lines, cabinets, cables and rails are normally grounded in a facility to an equal potential bar or to a planar ground. The metal pedestals of the raised floor are then connected to the planar ground under the raised floor. To further enhance ESD protection, the metal framework of the clean room wall systems are also connected to the planar ground. Air ionization systems are frequently installed at selected locations in a fabrication facility, to provide additional ESD control.

Despite the elaborate efforts spent in grounding process machines and various facilities, ESD damages still occur in a fabrication facility. A typical example is the occurrence of ESD when an insulating material is shipped or transported in a container made of another insulating material. For instance, when a reticle is transported from a storage facility to a photolithography machine in a container, i.e., a pod, that is normally constructed of a thermoplastic material. Since the reticle itself is an insulating material, i.e., a quartz or other silicon dioxide materials coated with a chrome coating, when the pod is handled by machine operators wearing insulating gloves, the static charge on the pod drastically increases due to friction generated between two insulating articles. Since the pod is not equipped with an anti-electrostatic device, high static electricity cumulates on the surface of the pod. For instance, it has been confirmed that the static electrical field generated on a pod surface increases from 0.1 KV/inch to nearly 15 KV/inch when a polycarbonate pod is rubbed with PVC gloves. Such a high static electricity build-up on the surface of the pod immediately causes an electrostatic discharge between the pod and the reticle contained therein. When ESD occurs between the pod and the reticle, the pattern on the reticle surface is usually damaged to such an extent that it can no longer be used for imaging. Conventional air ionization devices installed at a fabrication facility are not useful for preventing such ESD damages.

Others have proposed techniques for controlling or minimizing ESD damages to reticles carried in plastic containers. For instance, anti-electrostatic-type plastic materials, such as Bayon® has been used for the construction of the pod. However, due to its high cost, this type of anti-electrostatic plastic material cannot be widely utilized in a fabrication facility. Still others have proposed the use of gloves that are made of a conductive material such as Propex® so that the generation of electrostatic discharge can be avoided. The high cost of the Propex® gloves prohibits its broad usage in the processing industry.

Referring initially to FIG. 1 where it is shown a cross-sectional view of a container equipped with a conventional reticle support system. The container 10 is constructed of a top lid 12, a bottom lid 14, a left sidewall 18 and a right sidewall 16. The front and rear sidewalls (not shown) are constructed of similar materials, i.e., a thermoplastic material such as polycarbonate or polymethylmethacrylate. Support means 22 are positioned on the bottom lid 14 of the container for supporting a reticle 24. The reticle 24 is normally constructed of a transparent ceramic material such as quartz or other types of silicon dioxide. On a surface 26 of the reticle 24, a pattern 28 is formed by coating the surface with a suitable metallic material. The pattern 28 can be formed by one of many suitable metallic materials. A handle 32 is affixed to the top lid 12 of the container 10 for easy carrying by an operator. The $d_2$ value for the commercially obtained container is 3.365 cm.

In the conventional reticle container shown in FIG. 1, electrostatic discharge (ESD) damage is frequently encountered during a reticle handling process. Electrostatic charges may cumulate on the reticle pod, which in turn induce mask chrome feature damage by an electrostatic discharge. A damaged reticle may result in thousands of defective circuits being produced. With the recent advent in deep submicron technology, the ESD phenomenon becomes more serious as chrome feature on the reticle becomes smaller and closer together. An ESD easily occurs even at a lower electrical potential resulting in the chrome pattern melting and bridging. In most integrated circuit fabrication facilities where ESD problems are encountered, various approaches in eliminating the problem have been attempted regarding the issues of handling, equipment grounding, use of ionizer equipment and use of conductive materials for forming reticle storage boxes. However, most of these approaches are either too costly or cannot be used to retrofit thousands of reticle storage boxes already in use in the fab facility.

It is therefore an object of the present invention to provide an electrostatic discharge-free container that is equipped with a metal shield for holding an insulating article that does not have the drawbacks or shortcomings of the conventional containers that are made of an electrically insulating material.

It is another object of the present invention to provide an electrostatic discharge-free container that is equipped with a metal shield on the bottom lid of the container to substantially cover the bottom lid.

It is a further object of the present invention to provide an electrostatic discharge-free container that is equipped with a metal shield in a cup-shape to substantially surround an insulating article positioned in the container.

It is another further object of the present invention to provide an electrostatic discharge-free container that is equipped with a metal shield formed of a metal layer covering a bottom lid of the container and a cup-shaped metal enclosure which substantially surrounds the insulating article carried in the container.

It is still another object of the present invention to provide an electrostatic discharge-free container that is equipped with a metal shield wherein the metal shield is fabricated of a contaminant particle-free metallic material.

It is yet another object of the present invention to provide an electrostatic discharge-free container that is equipped with a metal shield inside the container and a metal knob in the top lid of the container.

It is still another further object of the present invention to provide an electrostatic discharge-free container that is equipped with a metal shield inside the container fabricated of stainless steel.

It is yet another further object of the present invention to provide an electrostatic discharge-free container that is equipped with a metal shield which includes a metal layer encapsulated inside a bottom lid as an insert that overlap substantially the bottom lid.

SUMMARY OF THE INVENTION

In accordance with the present invention, an electrostatic discharge-free container that is equipped with a metal shield for holding an insulating article is provided.

In a preferred embodiment, an electrostatic discharge-free container that is equipped with a metal shield for holding an insulating article therein is provided which includes a container body constructed of a top lid, a bottom lid and four side panels forming a cavity therein, wherein one of the four side panels allows access to the cavity, the top lid, the bottom lid and the four side panels are made of an electrically insulating material, at least four support means mounted on the bottom lid in a spaced-apart relationship for supporting the insulating article thereon, and an electrically conductive layer substantially overlaps the bottom lid so as to sufficiently shield the insulating article when positioned on the at least four support means.

The electrostatic discharge-free container equipped with a metal shield for holding an insulating article may further include a metallic knob situated in a top lid. The electrically conductive layer can be formed of a metallic material, or may be formed of a metallic material that does not produce contaminating particles, or may be formed of stainless steel. The electrically conductive layer may also be encapsulated as an insert in the bottom lid. The top lid, bottom lid and four sidewall panels may be formed of a substantially transparent plastic material. The container may further include an insert of an electrically conductive layer molded in the bottom lid. The container may further include a metal shield shaped substantially similar to the top lid for positioning between the top lid and the insulating article to form a metal enclosure with the electrically conductive layer on the bottom lid surrounding the insulating article.

In another preferred embodiment, an electrostatic discharge-free container which is equipped with a metal shield surrounding an insulating article may be provided which includes a container body constructed of a top lid, a bottom lid and four side panels forming a cavity therein, wherein one of the four sidewall panels allows access to the cavity, the top lid, bottom lid and four side panels may be formed of an electrically insulating material, a plurality of support means on the bottom lid for supporting the insulating article, a metal layer substantially covers the bottom lid and a cup-shaped metal enclosure positioned between the top lid and the insulating article cooperating with the metal layer on the bottom lid to substantially surround the insulating article.

In the electrostatic discharge-free container which is equipped with a metal shield surrounding an insulating article, the metal layer and the cup-shaped metal enclosure may be formed of a contaminating particle-free metallic material. The container may further include a metal knob situated in the top lid. The metal layer may be formed as an insert in the bottom lid. The container may further include a second metal layer being molded as an insert in the bottom lid. The top lid, bottom lid and four side panels may be formed of a substantially transparent plastic material. The metal layer and the cup-shaped metal enclosure may be formed of stainless steel. The insulating article positioned on the plurality of support means may be a chrome coated quartz reticle plate. The electrostatic discharge-free container may be a reticle pod for storing chrome coated reticle plate.

In still another preferred embodiment, an electrostatic discharge-free, electrically insulating container is provided which includes a metal enclosure for shielding an insulating article therein including a container body constructed of a top lid, a bottom lid and four side panels forming a cavity therein wherein one of the four side panels allows access to the cavity, the top lid, bottom lid and four side panels are formed of an electrically insulating material, a plurality of support means on the bottom lid for supporting the insulating article, a metal layer molded as an insert substantially overlaps the bottom lid, a cup-shaped metal enclosure positioned juxtaposed to the top lid cooperating with the metal layer to substantially surround the insulating article, and a metal knob situated in the top lid.

The electrostatic discharge-free, electrically insulating container which is equipped with a metal enclosure for shielding an insulting article may further include a second metal layer molded as an insert in the bottom lid. The metal layer and the cup-shaped metal enclosure may be fabricated of a contaminating particle-free metallic material.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENTS

The present invention discloses an electrostatic discharge-free container that is equipped with a metal shield for holding an insulating article therein. The present invention container may be suitably used for holding any insulating article without the electrostatic discharge problem, but more particularly, is suited for holding a reticle plate used in a semiconductor fabrication process which has a chrome pattern coated on an insulating plate of quartz.

In the present invention ESD-free container, a container body that is constructed of a top lid, a bottom lid and four side panels to form a cavity therein is first provided. One of the four side panels provides access to the cavity of the container through an access opening equipped with an access door. The top lid, the bottom lid and the four side panels are normally formed of an electrically insulating material such as a plastic material. The material may be optically transparent to allow easy inspection of the insulating article carried therein, Inside the container, a plurality of support means are mounted on the bottom lid in a space-apart relationship for supporting the insulating article on top. The metal shield for the present invention ESD-free container may be provided in many different forms, as described in the following five preferred embodiments.

The present invention provides a novel method for the low cost modification of reticle pods to achieve anti-ESD function in a reticle handling process. In the method, an electrostatic charge is shielded by a special design of a conductive film, e.g, a metal plate or film which effectively reduces the impact of ESD on chrome plated features on the reticle. The electrically conductive film further serves the function of electrical insulation during manual robbing of the reticle box which is normally fabricated of a non-conductive material. With the present invention novel metal shielding, no static charge will be generated by the manual robbing.

By utilizing the present invention novel ESD-free container equipped with a metal shield, the handling-induced electrostatic charge on the reticle pod is drastically reduced or eliminated. Even when a background static charge exists on the reticle pod, the static potential can be shielded by another metal shielding design which in turn eliminates any ESD damage to the reticle chrome feature. The present invention novel ESD-free container does not require the use of costly equipment such as an ionizer, anti-static gloves and static dissipitive pod designs.

Figure 1:
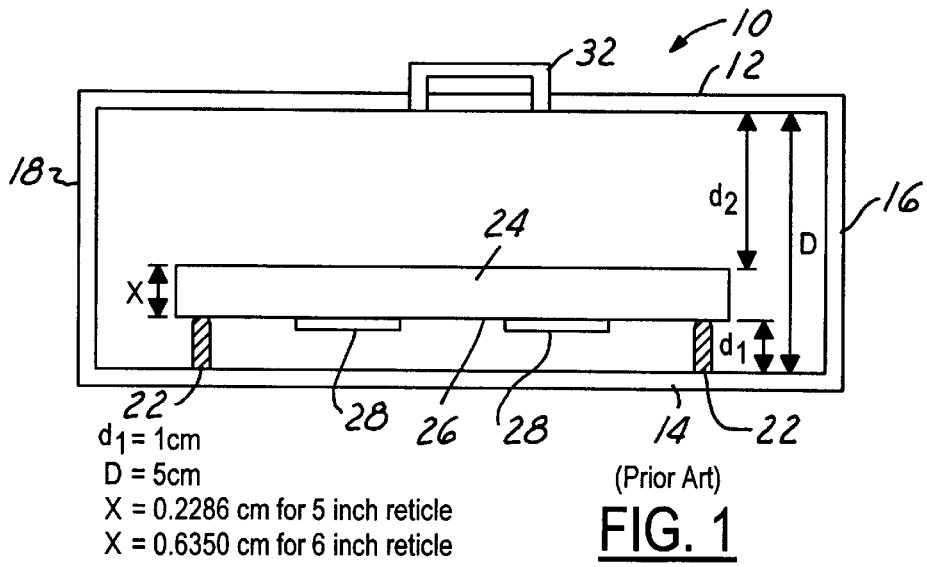
FIG. 1 is a cross-sectional view of a conventional reticle pod with a pedestal support system.
Figure 2A:
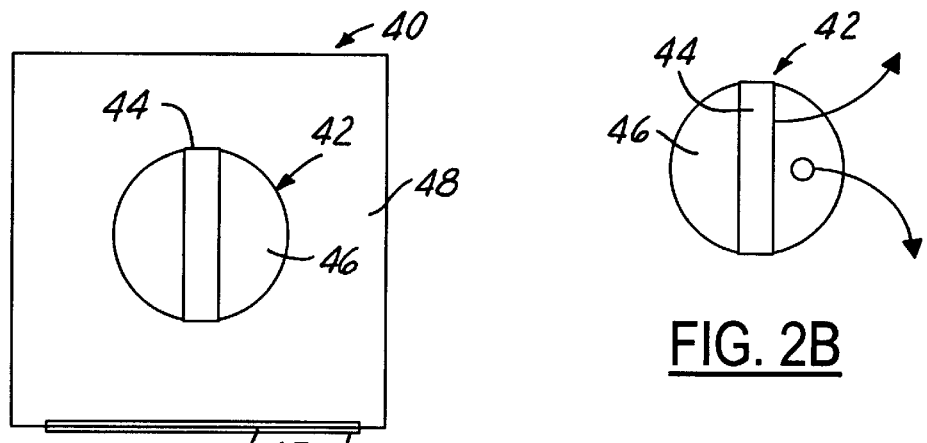
FIGS. 2A, 2B and 2C are plane views and a side view of the present invention electrostatic discharge-free reticle pod equipped with a metallic knob.
Figure 2B:
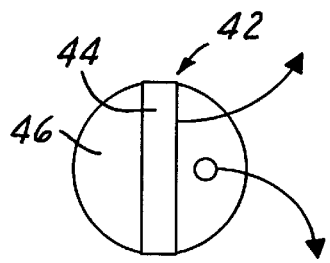
Figure 2C:
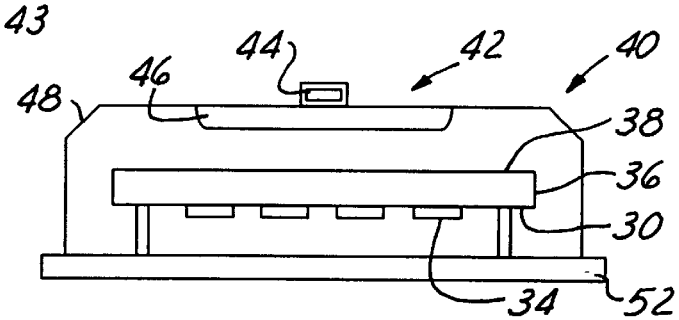

Referring now to FIGS. 2A–2C wherein an embodiment of the present invention ESD-free container 40 equipped with a metallic knob 42 is shown. One of the four side panels provides access to the cavity of the container 40 through an access opening 43 equipped with an access door 45. The metallic knob 42 is constructed by a handle portion 44 and a plate portion 46 which are both fabricated of a metallic material such as stainless steel. In the cross-sectional view shown in FIG. 2C, the metallic knob 42 helps to prevent ESD in container 40 by substantially shielding the backside 38 of the reticle plate 36. The use of the metallic knob 42 therefore prevents ESD damage to the chrome pattern 34 coated on the front surface 30 of the reticle plate 36. It should be noted that in the embodiment shown in FIGS. 2A–2C, the top lid 48 and the bottom lid 52 are not shielded by any metallic layer or film. It should also be noted that in a conventional reticle pod, the metallic knob 42 is not made of a metal, but instead is made of a plastic material which further contributes to the electrostatic charge built-up problem. When the handle 44 is replaced with a metallic material, and the plate 46 is covered by a metallic film or replaced by a metal material, an isolated, electrostatic charge-free pod is obtained.

Figure 3:
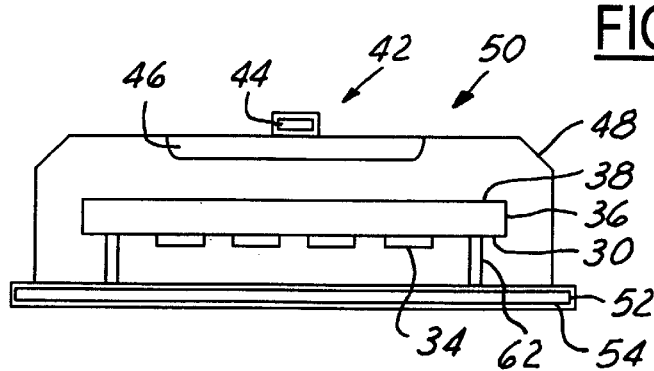
FIG. 3 is an illustration showing a cross-sectional view of a preferred embodiment of the present invention electrostatic discharge-free reticle pod equipped with a metal layer molded in the bottom lid.

A preferred embodiment of the present invention ESD-free container 50 is shown in FIG. 3. In this preferred embodiment, the ESD-free container 50 is constructed by the same metallic knob 42 situated in a top lid 48 over a bottom lid 52. However, a metal shielding layer 54 is inserted in the bottom lid 52 of the reticle pod 50. The insertion of the metal shielding layer 54 can be easily accomplished in a process such as plastic injection molding. In this preferred embodiment, even when a high electrostatic potential is existed on the reticle pod 50, for instance, at about 12~14 KV/inch, the electrostatic potential can be drastically reduced to about 2~4 KV/inch and thus the potential of ESD damage on the chrome pattern 34 on reticle plate 36 is eliminated. The metal film 54 can be advantageously provided in stainless steel or in any other metallic material that does not produce contaminating particles.

Figure 4:
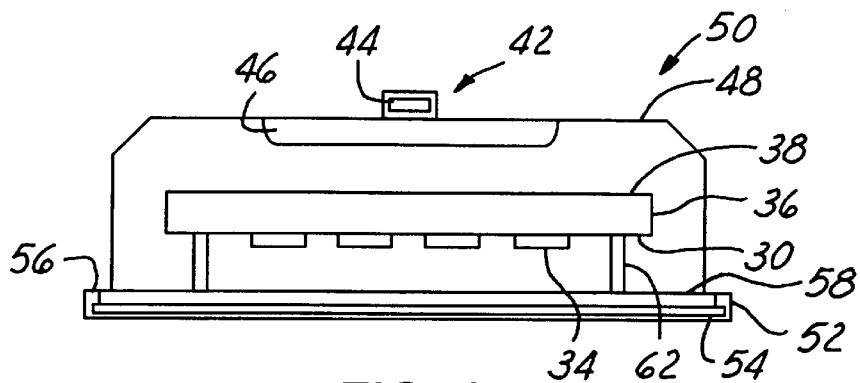
FIG. 4 is a cross-sectional view of a second preferred embodiment of the present invention electrostatic discharge-free reticle pod wherein a metal layer is formed on top of the bottom lid in addition to the metal layer molded inside the bottom lid.

In a second preferred embodiment shown in FIG. 4, a second metal layer 58 is provided on the top surface 56 of the bottom lid 52. The metal layer 58 is used in combination with the metal layer 54 encapsulated in the bottom lid 52. The additional metal layer, i.e. the second metal layer 58 further improves the anti-ESD property of the reticle pod 50 such that any chances of damage to the chrome pattern 34 by an electrostatic discharge is eliminated.

Figure 5:
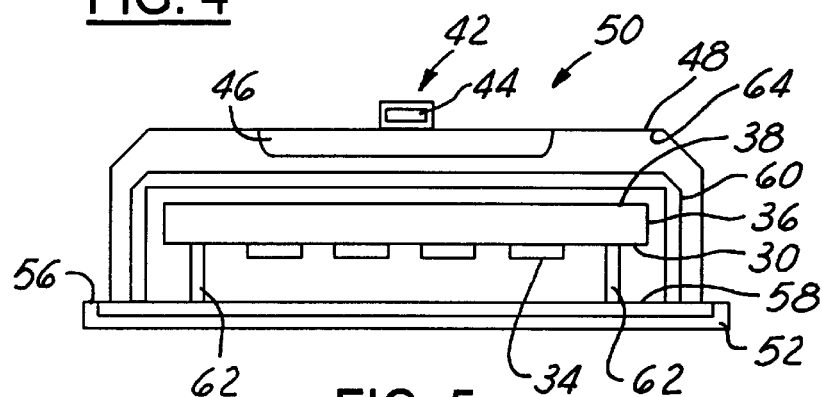
FIG. 5 is a cross-sectional view of a third preferred embodiment of the present invention electrostatic discharge-free reticle pod wherein a metal layer is coated on top of the bottom lid cooperating with a metal enclosure to form a shield.

In a third preferred embodiment, shown in FIG. 5, the reticle pod 50 is further equipped with a cup-shaped metal enclosure 60 which completely surrounds the reticle plate 36 positioned on the support means 62. It should be noted that the cup-shaped metal enclosure 60 can be fabricated of a thin metal material such as stainless steel. The metal enclosure 60 can be positioned inside the reticle pod 50 between the top lid 48 and the insulating article, or the reticle plate 36. Alternatively, the metal enclosure 60 may be advantageously formed integrally with the top lid 48 as a coating layer on the inside surface 64 of the top lid 48. Such alternative design may be accomplished by a coating or a plating technique in which a thin metal layer may be coated or plated on the inside surface 64 of the top lid 48.

In the third preferred embodiment, the bottom end of the metal enclosure 60 touches the metal layer 58 coated or positioned on the bottom lid 52 such that a completely shielded enclosure is formed. It is assumed that such a completely shielded enclosure would provide the highest degree of anti-ESD protection for the reticle plate 36. While the metal enclosure 60 can be formed as a free-standing member for the ESD-free container 50, it may be more practical to form the metal enclosure 60 unitarily with the top lid 48 by either a plating or a coating technique, as previously suggested This further facilitates the use of a metal enclosure and eliminates the need for the handling of a separate component in the ESD-free container 50. The metal enclosure 60, either in the form of a free-standing member or in the form of a plated or coated layer on the inside surface 64 of the top lid 48, may be suitably formed of stainless steel or of any other metallic material that does not generate contaminating particles in use.

Figure 6:
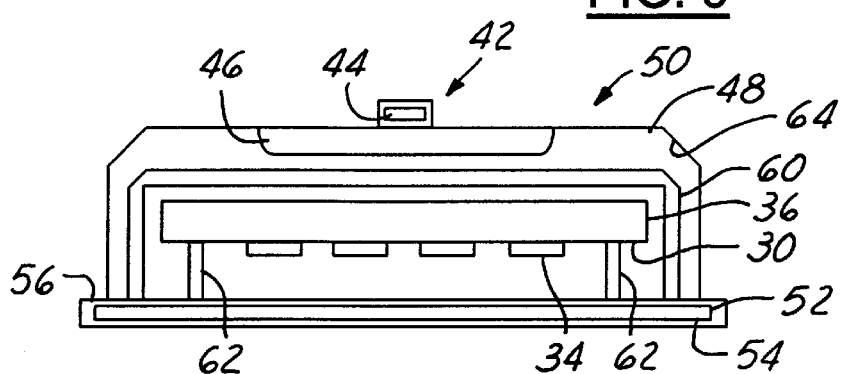
FIG. 6 is a cross-sectional view of a fourth preferred embodiment of the present invention electrostatic discharge-free reticle pod in which a metal layer is molded in the bottom lid cooperating with a metal enclosure to surround a reticle plate.

FIG. 6 shows another preferred embodiment, i.e. the fourth preferred embodiment, of the present invention ESD-free container 50. In this embodiment, a metal layer 54 which is molded-in as an insert in the bottom lid 52 is utilized without the second metal layer 58 as shown in FIG. 5. The metal enclosure 60 similar to that shown in the third preferred embodiment is also utilized to form a completely shielded enclosure by the metal enclosure 60 and the metal film layer 54. The desirable ESD-free effect achieved is similar to that obtained in the third preferred embodiment shown in FIG. 5.

Figure 7:
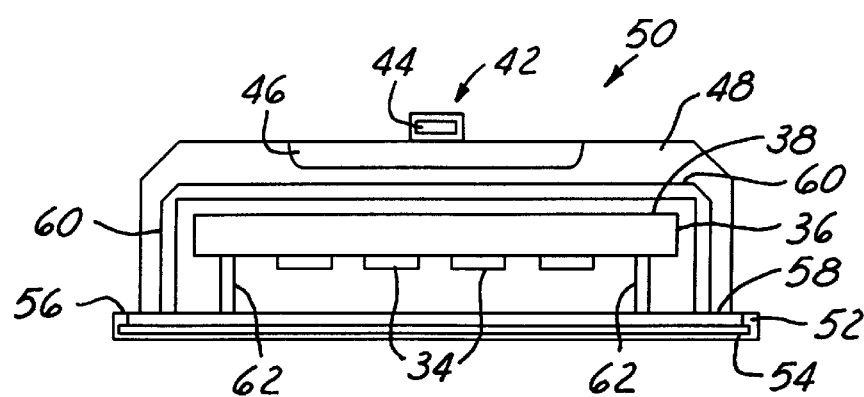
FIG. 7 is a cross-sectional view of a fifth preferred embodiment of the present invention electrostatic discharge-free reticle pod in which two metal layers in and on the bottom lid and a metal enclosure are utilized to surround a reticle plate.

In yet another preferred embodiment, i.e. the fifth preferred embodiment shown in FIG. 7, the present invention ESD-free container or reticle pod 50 is shown. In this preferred embodiment, both the first metal layer 54 insert molded in the bottom lid 52, and the second metal layer 58 coated or deposited on the top surface 56 of the bottom lid 52 are utilized to form a completely shielded chamber with the metal enclosure 60. It is believed that this preferred embodiment provides the best result in anti-ESD when compared to the third preferred embodiment in FIG. 5 and the fourth preferred embodiment in FIG. 6 since it combines both desirable features.

The present invention novel ESD-free container for holding an insulating article has been amply described in the above description and in the appended drawings of FIGS. 2A–7. It should be emphasized that the present invention can be accomplished by making simple modifications to existing reticle pods which are not equipped with a metal shield. The invention provides a low cost method for fixing a serious problem which does not require the scrap of existing reticle pods. For instance, ESD-free containers can be achieved by adding a simple metal knob in the top lid of the container. Even though it is more preferred that a metal layer should be provided on the bottom lid of the container to substantially cover the area of the bottom lid. The metal layer may further be molded inside the bottom lid as an insert to serve the metal shield function. It is even more preferred that a metal enclosure of a cup-shape is provided to substantially surround the insulating article carried in the container by positioning the metal enclosure in between the top lid and the insulating article. The metal enclosure may be formed unitary with the top lid, i.e., by forming the metal enclosure on the inside surface of the top lid such as by plating or by coating.

It is further preferred that the metal enclosure described above to be used in cooperation with a metal layer coated on the bottom lid that substantially cover the surface of the bottom lid and thus forming a complete enclosure of a metal shield for holding an insulating article.

The various preferred embodiments may be suitably selected depending on the specific application and the degree of ESD-free protection sought by the practitioner. It should be noted that the various preferred embodiments are shown for illustration purpose only, and as such, they do not limit the scope of the present invention in any way.

While the present invention has been described in an illustrative manner, it should be understood that the terminology used is intended to be in a nature of words of description rather than of limitation.

Furthermore, while the present invention has been described in terms of a number of preferred embodiments, it is to be appreciated that those skilled in the art will readily apply these teachings to other possible variations of the inventions.

The embodiment of the invention in which an exclusive property or privilege is claimed are defined as follows:

What is claimed is:

1. An electrostatic discharge-free container equipped with a metal shield for shielding an insulating article therein comprising:

a container body constructed a top lid, a bottom lid and four side panels forming a cavity therein, one of said four side panels having an access door allowing access to said cavity, said top lid, said bottom lid and said four side panels being formed of an electrically insulating material, a plurality of support means on said bottom lid for supporting said insulating article, a metal layer molded as an insert in and substantially overlaps said bottom lid, a cup-shaped metal enclosure positioned juxtaposed to said top lid cooperating with said metal layer, and a metal knob situated in said top lid.

2. An electrostatic discharge-free container equipped with a metal shield for holding an insulating article according to claim 1, wherein said top lid, bottom lid and four side panels being formed of a substantially transparent plastic material.

3. An electrostatic discharge-free container equipped with a metal shield for holding an insulating article according to claim 1, wherein said metal enclosure being formed of stainless steel.

4. An electrostatic discharge-free container equipped with a metal shield surrounding an insulting article according to claim 1, wherein said insulating article positioned on said plurality of support means being a chrome coated quartz reticle plate.

5. An electrostatic discharge-free container equipped with a metal shield surrounding an insulting article according to claim 1, wherein said electrostatic discharge-free container being a reticle pod for storing chrome coated quartz reticle plate.

6. An electrostatic discharge-free container equipped with a metal enclosure for shielding an insulating article according to claim 1 further comprising a second metal layer on said bottom lid.

7. An electrostatic discharge-free container equipped with a metal shield for shielding an insulating article according to claim 1, wherein said metal layer and said cup-shaped metal enclosure are fabricated of a contaminating particle-free metal.

* * * * *